(12) United States Patent
Gratz et al.

(10) Patent No.: US 11,887,852 B2
(45) Date of Patent: Jan. 30, 2024

(54) LATERAL TRANSISTOR WITH SELF-ALIGNED BODY IMPLANT

(71) Applicant: Infineon Technologies Dresden GmbH & Co. KG, Dresden (DE)

(72) Inventors: Achim Gratz, Dresden (DE); Juergen Faul, Radebeul (DE); Swapnil Pandey, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 14 days.

(21) Appl. No.: 17/357,369

(22) Filed: Jun. 24, 2021

(65) Prior Publication Data

US 2021/0407806 A1 Dec. 30, 2021

(30) Foreign Application Priority Data

Jun. 30, 2020 (DE) .......................... 102020117171.4

(51) Int. Cl.
*H01L 21/265* (2006.01)
*H01L 21/8234* (2006.01)
(Continued)

(52) U.S. Cl.
CPC .... *H01L 21/265* (2013.01); *H01L 21/823418* (2013.01); *H01L 29/66681* (2013.01); *H01L 29/7816* (2013.01)

(58) Field of Classification Search
CPC .......................... H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 21/3085; H01L 21/3086;
(Continued)

(56) References Cited

U.S. PATENT DOCUMENTS 4,707,218 A * 11/1987 Giammarco ........ H01L 21/3088
428/137
10,374,056 B2 8/2019 Kowalik-Seidl et al.
(Continued)

OTHER PUBLICATIONS

Ramalingam, S. et al. "Photoresist Trimming: Etch Solutions to CD Uniformity and Tuning," Semiconductor International, Aug. 1, 2002 (Year: 2002).*

*Primary Examiner* — Sonya McCall-Shepard
(74) *Attorney, Agent, or Firm* — Murphy, Bilak & Homiller, PLLC

(57) ABSTRACT

A method of manufacturing a lateral transistor is described. The method includes providing a semiconductor substrate. A dielectric layer is formed over the semiconductor substrate. A gate layer is formed over the dielectric layer. A photoresist layer is applied over the gate layer. The photoresist layer is opened by lithography to form a first opening of a first opening size in the photoresist layer. The first opening is transferred into a second opening of a second opening size, the second opening being either formed in the photoresist layer or in an auxiliary layer. A body region is formed in the semiconductor substrate by dopant implantation. Further the gate layer is structured to form a gate edge. An overlap between the structured gate layer and the body region is controlled by an offset between the first opening size and the second opening size.

12 Claims, 6 Drawing Sheets

(51) Int. Cl.
*H01L 29/66* (2006.01)
*H01L 29/78* (2006.01)
*H01L 21/266* (2006.01)
*H01L 29/10* (2006.01)
*H01L 29/06* (2006.01)

(58) Field of Classification Search
CPC . H01L 21/266; H01L 21/265; H01L 21/2652; H01L 29/66681; H01L 29/7816; H01L 29/66659; H01L 29/7835; H01L 29/1095; H01L 29/6656; H01L 29/66689; H01L 21/308; H01L 29/063; H01L 29/401; H01L 29/0878; H01L 29/1083; H01L 29/0603; H01L 29/0684; H01L 21/823418
See application file for complete search history.

(56) References Cited

U.S. PATENT DOCUMENTS

| | | |
|---|---|---|
| 2008/0073746 A1 | 3/2008 | Tanaka |
| 2015/0021686 A1 | 1/2015 | Shea et al. |
| 2015/0123199 A1 | 5/2015 | Chen et al. |
| 2016/0087081 A1 | 3/2016 | You et al. |
| 2018/0090613 A1* | 3/2018 | McGregor .......... H01L 29/4916 |

* cited by examiner

LATERAL TRANSISTOR WITH SELF-ALIGNED BODY IMPLANT

TECHNICAL FIELD

This disclosure relates generally to the field of manufacturing a transistor, in particular a lateral transistor with an insulated gate electrode.

BACKGROUND

Lateral transistors require short channel lengths for advanced performance. Further, the variability of the channel length needs to be minimized in order to achieve stable transistor parameters.

Short channel length and small channel length tolerances are often achieved by using a lateral diffusion of the body doping. The doping process can be carried out self-aligned and the diffusion process provides a highly stable lateral offset to the gate edge in order to not having to provide margin for overlay and feature size variability from the lithography process. However, the lateral diffusion process requires high temperature annealing, and there is often not enough thermal budget for achieving a sufficient diffusion length.

Hence, a well-controllable process of body doping is desired. In particular, the process should allow to generate channel lengths suitable for lateral transistors with low variability in length. In particular, the process should be applicable to a variety of different devices with a substantially lower constraint on the availability of thermal budget.

SUMMARY

According to an aspect of the disclosure, a method of manufacturing a lateral transistor comprises providing a semiconductor substrate. A dielectric layer is formed over the semiconductor substrate. A gate layer is formed over the dielectric layer. A photoresist layer is applied over the gate layer. The photoresist layer is opened by lithography to form a first opening of a first opening size in the photoresist layer. The first opening is transferred into a second opening of a second opening size, the second opening being either formed in the photoresist layer or in an auxiliary layer. A body region is formed in the semiconductor substrate by dopant implantation. Further the gate layer is structured to form a gate edge. An overlap between the structured gate layer and the body region is controlled by an offset between the first opening size and the second opening size.

According to an aspect of the disclosure, a lateral high-voltage transistor comprises a semiconductor substrate, a body region formed by dopant implantation in the semiconductor substrate, the body region having a lateral boundary, a dielectric layer arranged over the semiconductor substrate, and a structured gate layer arranged over the dielectric layer. The structured gate layer overlaps the body region in the semiconductor substrate in a zone between the lateral boundary of the body region and a gate edge of the structured gate layer. The lateral boundary of the body region is a boundary defined by dopant implantation.

BRIEF DESCRIPTION OF THE DRAWINGS

The elements of the drawings are not necessarily to scale relative to each other, with the exception of the contour-traced scanning electron microscope images which are true to scale. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "deposited", "arranged on", or "applied" or similar terms are not meant to mean that the elements or layers must directly be contacted together; intervening elements or layers may be provided between the "deposited", "arranged on", or "applied" elements, respectively. However, in accordance with the disclosure, the above-mentioned and similar terms may, optionally, also have the specific meaning that the elements or layers are directly contacted together, i.e. that no intervening elements or layers are provided between the "deposited", "arranged on", or "applied" elements, respectively.

Further, the words "over" or "beneath" with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
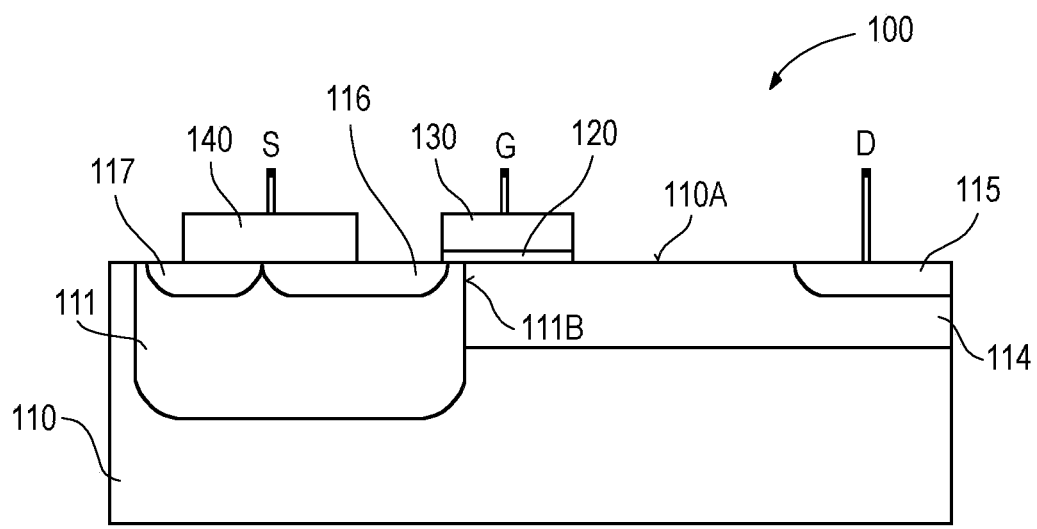
FIG. 1 is a schematic cross-sectional view of an exemplary lateral transistor.

FIG. 1 illustrates a schematic cross-sectional view of an exemplary lateral transistor 100. The transistor 100 is implemented in a semiconductor substrate 110. The semiconductor substrate 110 includes a body region 111 which has a lateral boundary 111B. In the example shown in FIG. 1, the lateral boundary 111B adjoins a drift region 114 implemented in the substrate 110. The transistor 100 further comprises a dielectric layer 120 which is arranged over the semiconductor substrate 110, e.g. on an upper surface 110A of the semiconductor substrate 110. A structured gate layer 130 is disposed over the dielectric layer 120. The body region 111 and/or the drift region 114 may extend to the upper surface 110A of the semiconductor substrate 110.

The structured gate layer 130 is electrically insulated from the body region 111 and from the drift region 114 by the dielectric layer 120. The structured gate layer 130 may form a gate electrode of the transistor 100, and the dielectric layer 120 may form the gate dielectric to provide for an insulated gate electrode. The structured gate layer 130 (gate electrode) may be connected to a gate node G.

Figure 2:
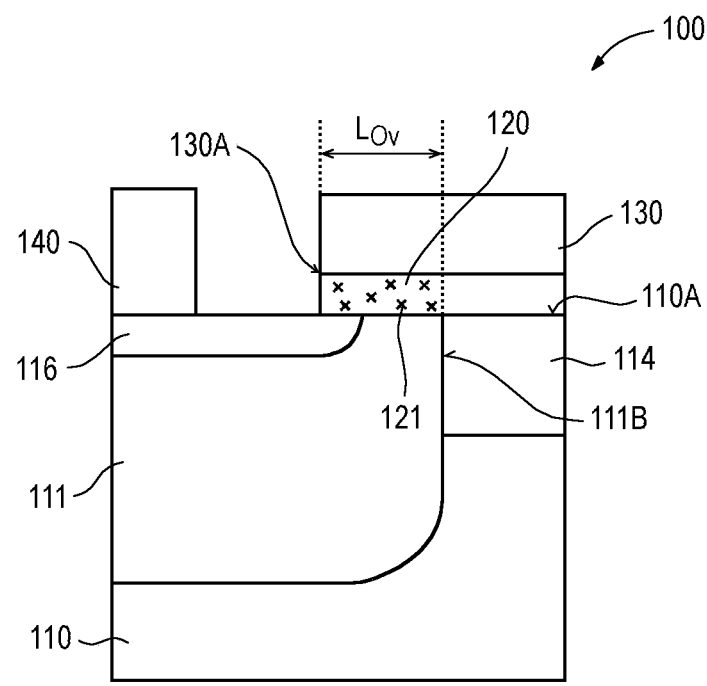
FIG. 2 is an enlarged cross-sectional view of a portion of the lateral transistor of FIG. 1.

As apparent from the enlarged view of FIG. 2, the structured gate layer 130 overlaps the body region 111 of the semiconductor substrate 110 in a zone between the lateral boundary 111B of the body region 111 and a gate edge 130A of the structured gate layer 130. The length of the overlap between the body region 111 and the structured gate layer 130 is denoted by $L_{Ov}$ in FIG. 2. As the channel of the transistor 100 is defined by this gate layer-body region overlap $L_{Ov}$ minus the underdiffusion of the source region 116 under the structured gate layer 130, the overlap length $L_{Ov}$ is usually somewhat greater than the actual channel length. For instance, the channel length and/or the overlap length $L_{Ov}$ may be equal to or greater than or less than 60 nm or 80 nm or 100 nm or 120 nm or 140 nm or 160 nm. In particular, the channel length and/or the overlap length $L_{ov}$ may, e.g., be between 80 nm and 140 nm.

As will be described in more detail further below, the lateral boundary 111B of the body region 111 is defined by dopant implantation (as opposed to dopant diffusion as caused, e.g., by an annealing process).

Due to its fabrication by dopant implantation, the dielectric layer 120 may include implantation damage 121 in a region overlaying (i.e. overlapping with) the body region 111, i.e. across the channel.

The transistor 100 may further comprise a source region 116. The source region 116 is formed in the body region 111 e.g. by an implantation process and electrically connects to a source node S via a source electrode 140. The body region 111 is electrically connected to the source electrode 140 by a low-resistance region 117 which provides the body contact of the transistor 100.

The transistor 100 may further comprise a drain region 115, with the drift region 114 being arranged between the body region 111 and the drain region 115. The drift region 114 may extend along the upper surface 110A of the semiconductor substrate 110 and the drain region 115 is arranged at the top of the lateral transistor 100 as well. The drain region 115 may be connected to a drain node D.

The transistor 100 is a field-effect controlled transistor with an insulated gate electrode (structured gate layer 130). The semiconductor substrate 100 may include or be of a semiconductor material such as, e.g., Si, SiC, SiGe, GaAs, GaN, AlGaN, InGaAs, InAlAs, etc. Without loss of generality, the following description exemplarily relates but is not restricted to a semiconductor substrate 110 which is of Si.

The transistor 100 may be implemented as a MOSFET (metal oxide semiconductor filed-effect transistor). In a MOSFET the drain region 115 has the same doping type as the source region 116.

Generally, the transistor 100 may be implemented as an n-type transistor or a p-type transistor. The transistor's type is defined by the doping type of the source region 116. In an n-type transistor 100 the source region 116, the drift region 114 and the drain region 115 are n-doped, while the body region 111 and the low-resistance region 117 are p-doped. In a p-type transistor 100 the source region 116, the drift region 114 and the drain region 115 are p-doped, while the body region 111 and the low-resistance region 117 are n-doped.

The dielectric layer 120 may include or be of an oxide, a nitride or a combination thereof. The structured gate layer 130 (gate electrode) may include or be of a metal or a highly doped polycrystalline semiconductor material, e.g. polycrystalline silicon.

The transistor 100 may be a power transistor. Alternatively or additionally, the transistor 100 may be a high-voltage transistor that switches on or off dependent on a voltage level of a voltage $V_{GS}$ between the gate node G and the source node S. Under normal operation conditions, in the off-state of the transistor 100, a voltage level of the drain-source voltage can increase up to the so-called voltage blocking capability. This voltage blocking capability can be up to one hundred or several hundred volts (V), for example equal to or greater than 100 V, 150 V, or 200 V. However, it is also possible that voltages below 100 V and even below 20 V are switched by the lateral transistor 100.

Referring to FIGS. 3A-3E, a process of forming a body region and a gate contact during manufacturing a lateral transistor is described. For instance, a transistor 100 as described by way of example in conjunction with FIGS. 1 and 2 may be manufactured by this process.

Figure 3A:
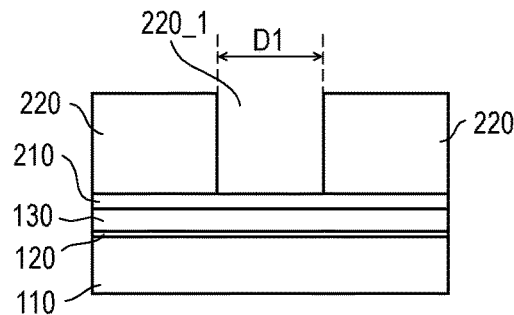
FIGS. 3A-3E are schematic cross-sectional views illustrating stages of a manufacturing process of a lateral transistor in accordance with a first example.

FIG. 3A illustrates a stage of the manufacturing process. Prior to the stage shown in FIG. 3A, the semiconductor substrate 110 was provided (e.g. fabricated) and the dielectric layer 120 was formed over the semiconductor substrate 110. The semiconductor substrate 110 may, e.g., be a semiconductor wafer and the process described herein may form part of the front-end-of-line (FEOL) processing of the semiconductor wafer.

Further, an (unstructured) gate layer 130 was formed over the dielectric layer 120. The gate layer 130 may, e.g., be of high-doped polycrystalline silicon or of a metal.

Optionally, a hard mask 210 was then formed over the gate layer 130. A photoresist layer 220 was applied over the gate layer 130 (and, e.g., over the optional hard mask 210). The photoresist layer 220 was then opened by lithography to form a first opening 220_1 of a first opening size D1 in the photoresist layer 220.

Figure 3B:
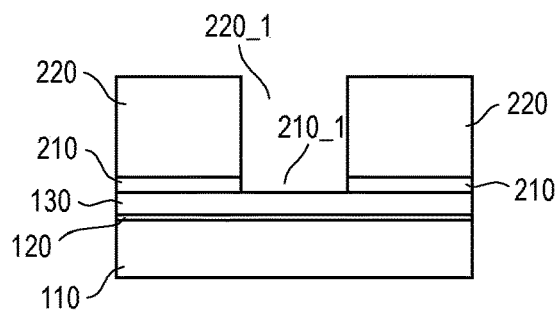

Referring to FIG. 3B, the first opening size D1 is "stored" in the optional hard mask 210. To this end the hard mask 210 may be structured in accordance with the first opening size D1. Structuring may, e.g., be carried out by a hard mask etch, wherein the first opening 220_1 of the photoresist layer 220 is used as an etch mask to generate an opening 210_1 in the hard mask 210.

Subsequently, the first opening size D1 is transferred into a second opening of a second opening size. In the example shown in FIG. 3C, the second opening is formed in the photoresist layer 220. The second opening in the photoresist layer 220 is denoted by reference sign 220_2, and the second opening size is referred to as D2.

In this case, the first opening 220_1 of the photoresist layer 220 is modified by a trim-back process. That is, the photoresist layer 220 in the first opening 220_1 is trimmed-back (i.e. widened) so that the second opening size D2 is larger than the first opening size D1.

The trim-back process is a process which does not involve lithography. The trim-back process can be carried out with very high precision. The trim-back process may be performed by photoresist etching. The offset between the first opening size D1 and the second opening size D2 may be controlled by the etch time and can be set with a precision of only a few nm. The uniformity of wall trimming may be equal to or less than 1 nm.

An etch process may be used for photoresist trimming. For instance, an $O_2$/HBr etch chemistry may be used for photoresist trimming. The photoresist trimming does not affect the underlying hard mask 210.

As will be described in more detail further below, the trimming process defines the overlap length $L_{Ov}$. The overlap length $L_{Ov}$ is set by using a self-aligned process based on the first and second opening sizes D1 and D2. More specifically, $L_{Ov}=(D2-D1)/2$.

Figure 3C:
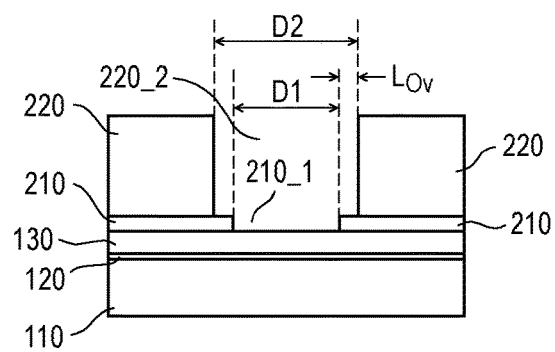
Figure 3D:
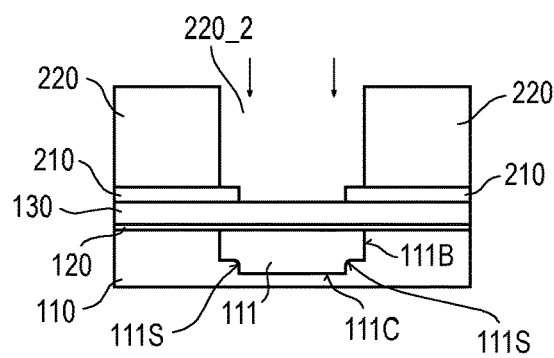

Referring to FIG. 3D a dopant implantation process (illustrated by the arrows in FIG. 3D) is used to form the body region 111 in the semiconductor substrate 110. The implantation of the dopant is masked by the photoresist layer 220, i.e. the lateral extension of the body region 111 corresponds with the second opening 220_2 (of the second opening size D2) in the photoresist layer 220. Hence, the lateral boundary 111B of the body region 111 is aligned with the second opening size D2 and therefore, in this example, with the second opening 220_2 in the photoresist layer 220.

It is to be noted that the implanted dopant passes through the dielectric layer 120, the gate layer 130 and, in a zone between the second opening size D2 and the first opening size D1, through the hard mask 210. As a consequence, the dielectric layer 120 may be provided with the implantation damage 121 shown in FIG. 2. Further, as the body region 111 is partly screened by the hard mask 210 within the zone between the second opening size D2 and the first opening size D1, a lower boundary 111C of the body region 111 in the semiconductor substrate 110 may have a stepped profile 111S. The length of the stepped profile 111S may approximately correspond with the overlap length $L_{Ov}$.

Figure 3E:
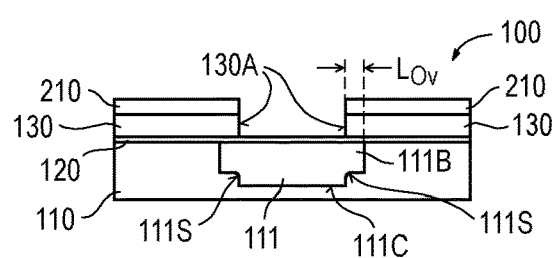

Referring to FIG. 3E, the photoresist layer 220 is then removed (so-called photoresist strip). The hard mask 210 may then be used to structure the gate layer 130. More specifically, the first opening 220_1 transferred to the hard mask 210 may be used to define the gate edge 130A of the transistor 100.

The structuring of the gate layer 130 may, e.g., be carried out by an etch process. The etch process needs to be selective between the material of the gate layer 130 and the material of the dielectric layer 120. That is, if the gate layer 130 is, e.g., made of a highly doped polycrystalline silicon (i.e. is a so-called polygate) and the dielectric layer 120 is of silicon oxide, the etch chemistry needs to be selective between highly doped polycrystalline silicon and silicon oxide.

As described above, the distance between the gate edge 130A and the lateral boundary 111B of the body region 111 represents the overlap length $L_{Ov}$. Further, FIG. 3E illustrates that the process exemplified by the manufacturing stages shown in FIGS. 3A-3E is configured to fabricate two transistor cells located opposite each other. The overlap lengths $L_{Ov}$ of these two transistor cells have precisely (e.g. within a margin of a few 1 nm or less) the same values.

In the manufacturing process described in conjunction with FIGS. 3A-3E, the hard mask 210 was used as a means for "remembering" the first opening 220_1 of the first opening size D1, which was then modified into the second opening 220_2 of the second opening size D2. Other non-lithography techniques may, e.g., also be feasible to provide for this function.

The manufacturing process may then continue by removing the hard mask 210 and/or by further processing the semiconductor substrate 110 and the body region 111. For instance, the low resistance region 111_2 and/or the source region 116 may be formed in the body region 111 (see FIGS. 1 and 2). Further, the drain region 115 may be formed in the semiconductor substrate 110 and/or the drift region 114, located above the drain region 115, may be formed in the semiconductor substrate 110. The processes of forming the drain region 115 and/or the drift region 114 may also have been carried out before performing the manufacturing stages illustrated in FIGS. 3A-3E.

Figure 4A:
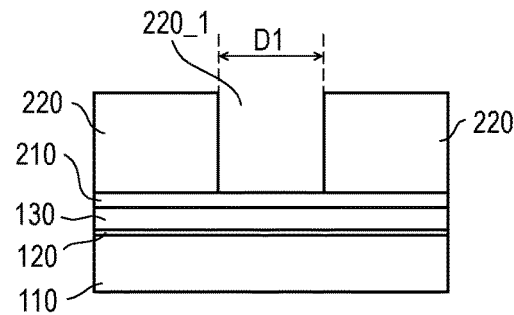
FIGS. 4A-4E are schematic cross-sectional views illustrating stages of a manufacturing process of a lateral transistor in accordance with a second example.

FIGS. 4A-4E illustrate another example of a process of fabricating a lateral high semiconductor voltage transistor 100 in accordance with the disclosure. The manufacturing stage illustrated in FIG. 4A is identical with the manufacturing stage of FIG. 3A except that the first opening 220_1 in the photoresist layer 220 has a greater first opening size D1 than in FIG. 3A (more specifically, the first opening size D1 in FIG. 4A may, e.g., correspond to the second opening size D2 in FIG. 3C). Apart from that, reference is made to the above description in conjunction with FIG. 3A to avoid reiteration.

Figure 4B:
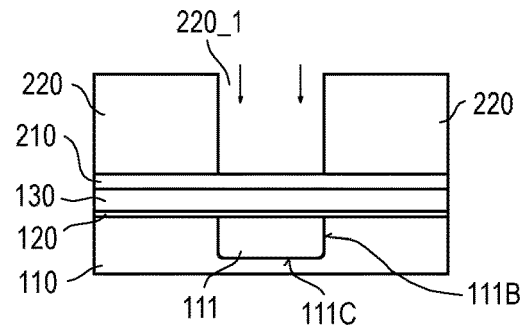

FIG. 4B illustrates the manufacturing stage of forming the body region 111 in the semiconductor substrate 110 by dopant implantation. In this case, dopant implantation is controlled by the photoresist layer 220 and, more specifically, performed within the zone of the first opening 220_1. The implantation process is carried out the same way as described in conjunction with FIG. 3D, and reference is made to the corresponding description for the sake of brevity. However, as a difference to the dopant implantation process illustrated in FIG. 3D, the dopant implantation in FIG. 4B passes across the entire first opening 220_1 through the hard mask 210. Therefore, the lower boundary 111C of the body region 111 is not provided with a stepped profile 111S (see FIG. 3D) beneath the lateral boundary 111B of the body region 111.

Figure 4C:
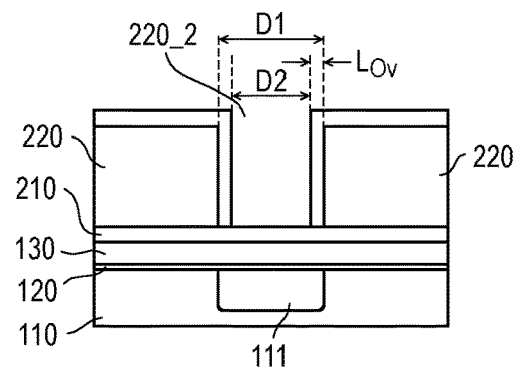

Referring to FIG. 4C, the first opening 220_1 is transferred or modified into a second opening 220_2 of a second opening size D2 formed in the photoresist layer 220. In this case, transferring the first opening 220_1 into the second opening 220_2 includes swelling the photoresist layer 220 so that the second opening size D2 is smaller than the first opening size D1. More specifically, the second opening size D2 in FIG. 4A may, e.g., correspond to the first opening size D1 in FIG. 3C.

The process of decreasing the opening size from D1 to D2 is a process which does not involve lithography. The process can be carried out with about the same precision as the process of enlarging the opening size in the photoresist layer 220 as explained in conjunction with FIG. 3C.

The swelling or resist-growing process can be carried out by photoresist silylation. In this case, a silylable photoresist is used. Photoresist silylation may be performed by applying a silicon-organic chemistry to a silylable photoresist material. The growth or swelling rate is low and the process can be controlled within approximately the same margins as the photoresist trimming process described in conjunction with FIG. 3C. That is, the modification of the first opening size D1 into the second opening size D2 can be controlled with a tolerance of a few nm and a high uniformity within a margin of, e.g., 1 nm or less is feasible.

Again, the first and second opening sizes D1, D2 define the overlap length $L_{Ov}$ of the transistor 100 to be manufactured. Here, $L_{Ov}$ is set by a self-aligned process and can be written as $L_{Ov}=(D1-D2)/2$.

Figure 4D:
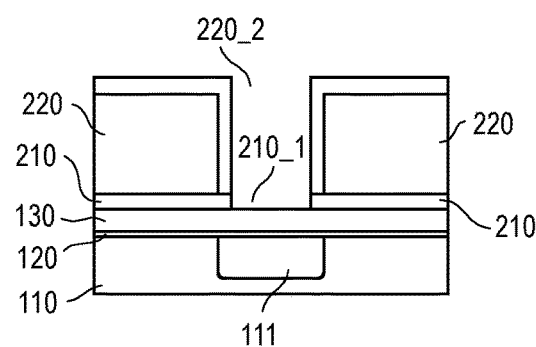

Referring to FIG. 4D, the hard mask 210 is structured in accordance with the second opening size D2. Structuring may, e.g., be carried out by a hard mask etch, wherein the second opening 220_2 of the photoresist layer 220 is used as an etch mask to generate an opening 210_1 in the hard mask 210. In this context reference is made to the description in conjunction with FIG. 3B.

Figure 4E:
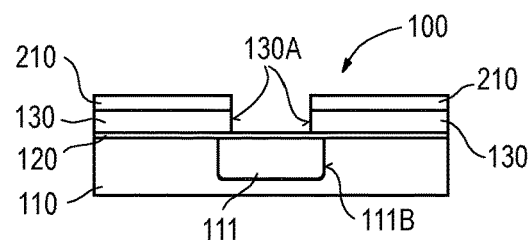

The photoresist layer 220 may then be removed, see FIG. 4E. The structured hard mask 210 can then be used to structure the gate layer 130 to form the gate edge 130A. That is, in this case the hard mask 210 may be used to "remember" the second opening size D2 after the photoresist layer 220 has been removed.

Alternatively, it may also be possible to structure the gate layer 130 under the control of the swollen photoresist layer 220, i.e. at the manufacturing stage shown in FIG. 4D. In this case a hard mask 210 is not needed, i.e. the entire process can be carried out without using a hard mask 210.

Optional process steps relating to further processing the body region 111 and/or the semiconductor substrate 110 have been described before, and reference is made to this disclosure in order to avoid reiteration.

Figure 5A:
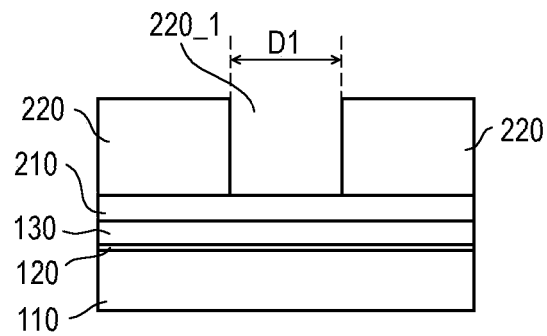
FIGS. 5A-5H are schematic cross-sectional views illustrating stages of a manufacturing process of a lateral transistor in accordance with a third example.
Figure 5B:
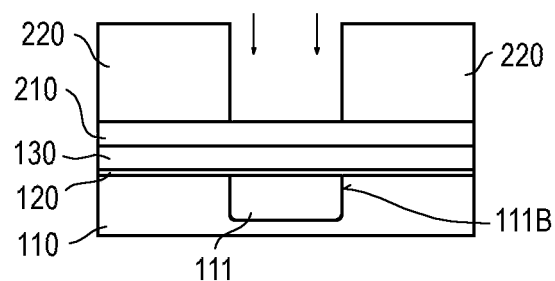

FIGS. 5A-5H illustrate stages of another exemplary manufacturing process of a lateral transistor 100. The initial stages of the manufacturing process shown in FIGS. 5A and 5B are identical to the stages of FIGS. 4A and 4B, and reference is made to the above description to avoid reiteration.

Figure 5C:
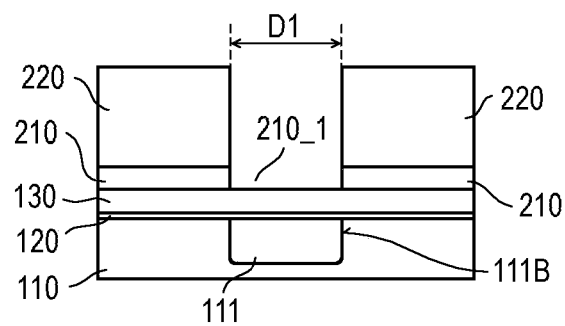

Referring to FIG. 5C, the hard mask 210 is structured to form the hard mask opening 210_1 in accordance with the first opening size D1. The structuring of the hard mask 210 may also be carried out before forming the body region 111 by dopant implantation, i.e. the order of the processes illustrated in FIGS. 5B and 5C could be exchanged.

Figure 5D:
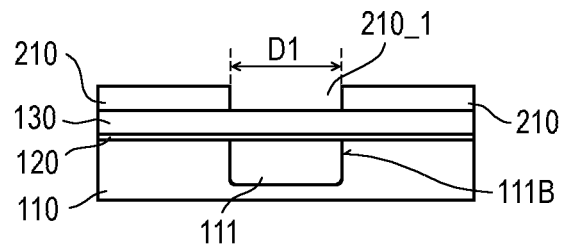

Referring to FIG. 5D, the photoresist layer 220 is then removed (photoresist strip).

Figure 5E:
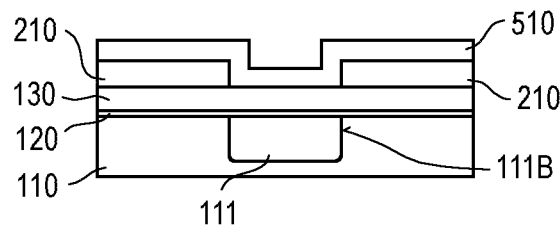

Referring to FIG. 5E, a spacer layer 510 is formed over the structured hard mask 210 and the hard mask opening 210_1. The spacer layer 510 may cover both the horizontal surfaces and the vertical surfaces (i.e. the walls of the opening 210_1) of the hard mask 210.

Figure 5F:
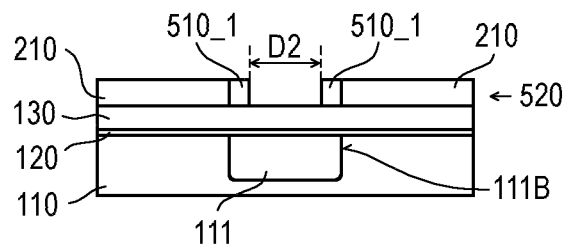

Referring to FIG. 5F, the spacer layer 510 may then be partially removed. For instance, removal of the spacer layer 510 may be carried out by an etch process. In this case, the material of the spacer layer 510 is chosen to be selective (in terms of etching) to the material of the hard mask 210 and to the material of the gate layer 130. That is, the etch process for removing the material of the spacer layer 510 stops both at the hard mask 210 and at the gate layer 130. The spacer layer 510 may, e.g., comprise or be of silicon nitride.

As a result, a wall portion 510_1 of the spacer layer 510 remains in the opening 210_1 of the mask layer 210. The wall portion 510_1 transfers the first opening size D1 of the opening 210_1 of the hard mask 210 into the second opening size D2. Again, the transfer of the first opening 220_1 of the first opening size D1 into a second opening of the second opening size D2 is carried out by a process which does not involve lithography as illustrated in FIGS. 5E and 5F. However, in this manufacturing method, the second opening is not formed in the photoresist layer 220 but in an auxiliary layer 520 which is, e.g., comprised or composed of the structured hard mask 210 and the structured spacer layer 510. More specifically, the auxiliary layer 520, as shown in FIG. 5F, includes the second opening of the second opening size D2 defined by the wall portions 510_1 of the structured spacer layer 510.

Figure 5G:
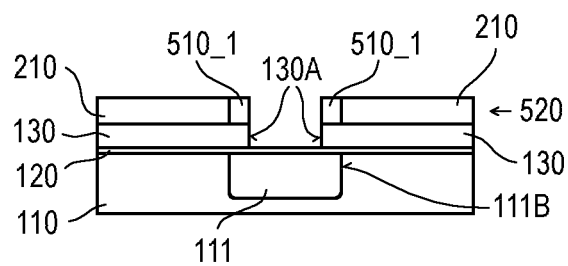

FIG. 5G illustrates structuring the gate layer 130 to form the gate edge 130A. The gate layer 130 is structured under the control of the auxiliary layer 520, i.e. in alignment with the second opening size D2.

As a result, the overlap length $L_{Ov}$ is set by a self-aligned process based on the first and second opening sizes D1 and D2. More specifically, in this example, $L_{Ov}=(D1-D2)/2$.

Figure 5H:
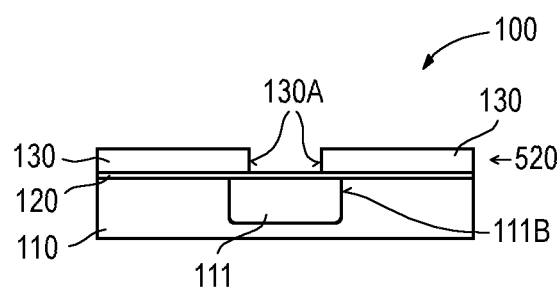

The auxiliary layer 520 may then be removed as shown in FIG. 5H. The following processing, again, depends on the type of the lateral transistor 100 to be formed and reference is made to the above description to avoid reiteration.

All processes as described herein have in common that the lateral boundary 111B of the body region 111 is defined by dopant implantation. Hence, no high temperature processes are needed to drive the dopant by diffusion under the structured gate layer 130 to generate a channel of sufficient length. The overlap length $L_{Ov}$ can be controlled with high precision and small tolerances. Further, the overlap lengths $L_{Ov}$ of the opposite transistor cells are virtually identical. For instance, the overlap length may, e.g., be between 80 nm and 140 nm or, in particular, between 90 nm and 110 nm.

The processes described herein avoid using a second lithography process. Typically, the overlay error (i.e. the unavoidable alignment offset) between a first lithography process and a second lithography process is in the order of 100 nm. Therefore, a small channel length as, e.g., required for high-voltage transistors cannot or only with a very low degree of reliability be produced when gate structuring and dopant implantation would be controlled by multiple lithography steps. In all examples described herein, dopant implantation relative to gate structuring (i.e. the definition of the channel length) is carried out by using a self-aligned process.

Figure 6:
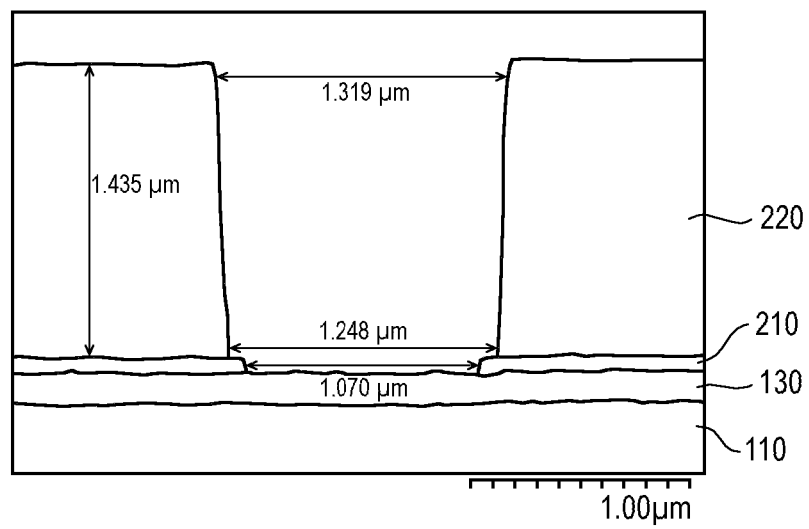
FIG. 6 is a contour-traced scanning electron microscope image illustrating a structure corresponding to the schematic cross-sectional view of FIG. 3C.
Figure 7:
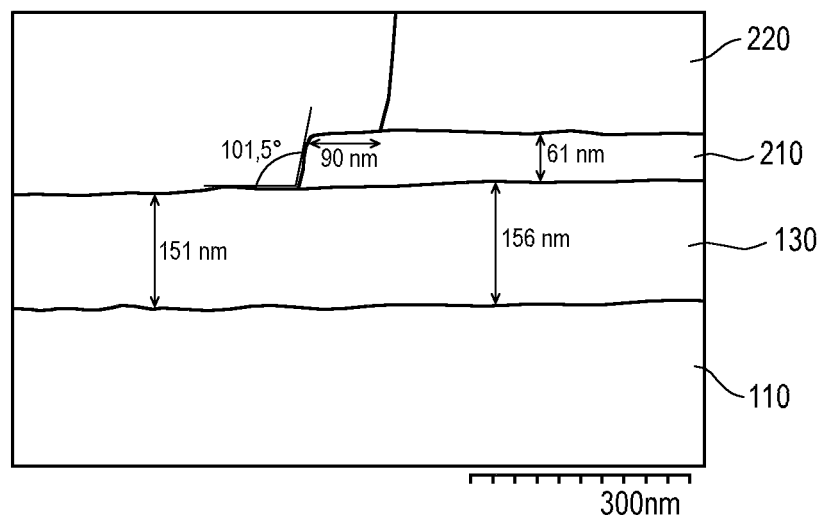
FIG. 7 is an enlarged section of the contour-traced scanning electron microscope image of FIG. 6.

FIG. 6 and FIG. 7 (which is an enlarged partial view of FIG. 6) illustrate a contour-traced scanning electron microscope (SEM) image of an exemplary semiconductor structure corresponding to the schematic cross-sectional view of FIG. 3C. In this example the photoresist layer 220 has a thickness of, e.g., 1.435 μm. The first opening size D1 is, e.g., 1.070 μm. The second opening size D2 is, e.g., 1.248 μm (as measured closed to the hard mask 210). The hard mask 210 may have a thickness of, e.g., 61 nm. The gate layer 130 may have a thickness of, e.g., between 151 nm and 156 nm. An overlap length $L_{Ov}$ of about 90 nm was obtained in this example, and it was shown that other overlap lengths $L_{Ov}$ between, e.g., 30 nm to 120 nm or more could also obtained by this process. The dielectric layer 120 is not visible in the SEM image shown in FIGS. 6 and 7.

The following examples pertain to further aspects of the disclosure:

Example 1 is a method of manufacturing a lateral transistor, the method comprising: providing a semiconductor substrate; forming a dielectric layer over the semiconductor substrate; forming a gate layer over the dielectric layer; applying a photoresist layer over the gate layer; opening the photoresist layer by lithography to form a first opening of a first opening size in the photoresist layer; transferring the first opening into a second opening of a second opening size, the second opening being either formed in the photoresist layer or in an auxiliary layer; forming a body region in the semiconductor substrate by dopant implantation; and structuring the gate layer to form a gate edge; wherein an overlap between the structured gate layer and the body region is controlled by an offset between the first opening size and the second opening size.

In Example 2, the subject matter of Example 1 or 2 can optionally include wherein transferring the first opening into the second opening includes trimming back the photoresist layer so that the second opening size is larger than the first opening size.

In Example 3, the subject matter of Example 2 can optionally include wherein structuring the gate layer is controlled by the first opening size and forming the body region is controlled by the second opening size.

In Example 4, the subject matter of any preceding Example can optionally further include: forming a hard mask over the gate layer; structuring the hard mask in accordance with the first opening size; and structuring the gate layer by using the structured hard mask.

In Example 5, the subject matter of Example 1 can optionally include wherein transferring the first opening into the second opening includes swelling the photoresist layer so that the second opening size is smaller than the first opening size.

In Example 6, the subject matter of Example 5 can optionally include wherein structuring the gate layer is controlled by the second opening size and forming the body region is controlled by the first opening size.

In Example 7, the subject matter of Example 5 or 6 can optionally further include: forming a hard mask over the gate layer; structuring the hard mask in accordance with the second opening size; and structuring the gate layer by using the structured hard mask.

In Example 8, the subject matter of Example 1 can optionally include wherein forming the second opening in the auxiliary layer comprises: forming a hard mask over the gate layer; structuring the hard mask in accordance with the first opening size to provide for a hard mask opening; forming a spacer layer over the structured hard mask and the hard mask opening; and removing the spacer layer except a wall portion of the spacer layer at a side wall of the hard mask opening to narrow the first opening size to the second opening size.

In Example 9, the subject matter of any preceding Example can optionally include wherein forming the body region in the semiconductor substrate by dopant implantation is carried out after forming the dielectric layer over the semiconductor substrate.

In Example 10, the subject matter of any preceding Example can optionally include forming a source region of a first doping type in the body region, wherein the dopant implanted in the body region is of a second doping type.

In Example 11, the subject matter of Example 10 can optionally include forming a low-resistance region of the second doping type in the body region, the low-resistance region adjoining a source electrode.

In Example 12, the subject matter of Example 10 or 11 can optionally include forming a drift region of the first doping type in the semiconductor substrate; and forming a drain region adjoining the drift region.

Example 13 is a lateral transistor, including: a semiconductor substrate; a body region formed by dopant implantation in the semiconductor substrate, the body region having a lateral boundary; a dielectric layer arranged over the semiconductor substrate; a structured gate layer arranged over the dielectric layer, wherein the structured gate layer overlaps the body region in the semiconductor substrate in a zone between the lateral boundary of the body region and a gate edge of the structured gate layer; wherein the lateral boundary of the body region is a boundary defined by dopant implantation.

In Example 14, the subject matter of Example 13 can optionally include wherein a length of the zone is between 80 nm and 140 nm.

In Example 15, the subject matter of Example 13 or 14 can optionally include wherein a lower boundary of the body region in the semiconductor substrate has a stepped profile, wherein a length of the stepped profile corresponds to the length of the zone.

In Example 16, the subject matter of any of Examples 13 to 15 can optionally further include wherein the dielectric layer includes implantation damage in a region overlaying the body region.

In Example 17, the subject matter of any of Examples 13 to 16 can optionally include wherein the zone forms the channel of the transistor.

In Example 18, the subject matter of any of Examples 13 to 17 can optionally include a source region formed in the body region, wherein the source region is of a first doping type and the dopant implanted in the body region is of a second doping type.

In Example 19, the subject matter of any of Examples 13 to 18 can optionally include a low-resistance region of the second doping type in the body region, the low-resistance region adjoining a source electrode.

In Example 20, the subject matter of any of Examples 13 to 19 can optionally include a drift region of the first doping type in the semiconductor substrate; and a drain region adjoining the drift region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a lateral transistor, the method comprising:
   providing a semiconductor substrate;
   forming a dielectric layer over the semiconductor substrate;
   forming a gate layer over the dielectric layer;
   applying a photoresist layer over the gate layer;
   opening the photoresist layer by lithography to form a first opening of a first opening size in the photoresist layer;
   transferring the first opening into a second opening of a second opening size, the second opening being either formed in the photoresist layer or in an auxiliary layer;
   forming a body region in the semiconductor substrate by dopant implantation; and
   structuring the gate layer to form a gate edge,
   wherein an overlap between the structured gate layer and the body region is controlled by an offset between the first opening size and the second opening size.

2. The method of claim 1, wherein transferring the first opening into the second opening comprises trimming back the photoresist layer so that the second opening size is larger than the first opening size.

3. The method of claim 1, wherein structuring the gate layer is controlled by the first opening size and forming the body region is controlled by the second opening size.

4. The method of claim 1, further comprising:
   forming a hard mask over the gate layer;
   structuring the hard mask in accordance with the first opening size; and
   structuring the gate layer by using the structured hard mask.

5. The method of claim 1, wherein transferring the first opening into the second opening comprises swelling the photoresist layer so that the second opening size is smaller than the first opening size.

6. The method of claim 5, wherein structuring the gate layer is controlled by the second opening size and forming the body region is controlled by the first opening size.

7. The method of claim 5, further comprising:
   forming a hard mask over the gate layer;

structuring the hard mask in accordance with the second opening size; and structuring the gate layer by using the structured hard mask.

8. The method of claim 1, wherein forming the second opening in the auxiliary layer comprises:

forming a hard mask over the gate layer;

structuring the hard mask in accordance with the first opening size to provide for a hard mask opening;

forming a spacer layer over the structured hard mask and the hard mask opening; and removing the spacer layer except a wall portion of the spacer layer at a side wall of the hard mask opening to narrow the first opening size to the second opening size.

9. The method of claim 1, wherein forming the body region in the semiconductor substrate by dopant implantation is carried out after forming the dielectric layer over the semiconductor substrate.

10. The method of claim 1, further comprising:

forming a source region of a first doping type in the body region, wherein the dopant implanted in the body region is of a second doping type.

11. The method of claim 10, further comprising: forming a low-resistance region of the second doping type in the body region, the low-resistance adjoining a source electrode.

12. The method of claim 10, further comprising: forming a drift region of the first doping type in the semiconductor substrate; and forming a drain region adjoining the drift region.

* * * * *